United States Patent
Patelmo et al.

(10) Patent No.: US 6,274,411 B1
(45) Date of Patent: Aug. 14, 2001

(54) METHOD FOR MANUFACTURING ELECTRONIC DEVICES, COMPRISING NON-SALICIDED NON-VOLATILE MEMORY CELLS, NON-SALICIDED HV TRANSISTORS, AND LV TRANSISTORS WITH SALICIDED JUNCTIONS WITH FEW MASKS

(75) Inventors: Matteo Patelmo, Trezzo Sull'Adda; Bruno Vajana, Bergamo; Giovanna Dalla Libera, Monza; Carlo Cremonesi, Vaprio D'Adda; Nadia Galbiati, Seregno, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/469,849

(22) Filed: Dec. 21, 1999

(30) Foreign Application Priority Data

Dec. 22, 1998 (EP) ..................... 9883071

(51) Int. Cl.$^7$ ...................... H01L 21/335; H01L 21/8232
(52) U.S. Cl. ............................. 438/142; 438/266
(58) Field of Search .................. 438/142, 201, 438/258, 257, 275, 593, 153, 163, 232, 264, 231, 266, 305, 306

(56) References Cited

U.S. PATENT DOCUMENTS

| | | | |
|---|---|---|---|
| 5,024,960 | * 6/1991 | Haken | 438/200 |
| 5,472,887 | * 12/1995 | Hutter et al. | 438/34 |
| 6,010,929 | * 1/2000 | Chapman | 438/226 |
| 6,087,211 | * 7/2000 | Kalnitsky et al. | 438/232 |

FOREIGN PATENT DOCUMENTS

| | | |
|---|---|---|
| 0 216 053 A2 | 4/1987 | (EP) . |
| 0 811 983 A1 | 12/1997 | (EP) . |
| 09283643 | 10/1997 | (JP) . |

OTHER PUBLICATIONS

Wolf, Stanley and Richard N. Tauber, *Silicon Processing for the VLSI Era, vol. 3*, Lattice Press, Sunset Beach, California, 1986, pp. 608–611.

Shiba, Kazuyoshi and Katsuhiko Kubota, "Downscaling of Floating–gate EEPROM Modules for ASIC Applicatiuons," *Electronics and Communications in Japan*, Part 2 75(12): 67–76, 1992.

\* cited by examiner

Primary Examiner—David Nelms
Assistant Examiner—David Nhu
(74) Attorney, Agent, or Firm—Theodore E. Galanthay; E. Russell Tarleton; Seed IP Law Group PLLC

(57) ABSTRACT

A method of forming source and drain regions for LV transistors that includes the steps of forming sacrificial spacers laterally to LV gate regions; forming LV source and drain regions in a self-aligned manner with the sacrificial spacers; removing the sacrificial spacers; forming HV gate regions of HV transistors; forming gate regions of selection transistors; forming control gate regions of memory transistors; simultaneously forming LDD regions self-aligned with the LV gate regions, HV source and drain regions self-aligned with the HV gate regions, source and drain regions self-aligned with the selection gate region and floating gate region; depositing a dielectric layer; covering the HV and memory areas with a protection silicide mask; anisotropically etching the dielectric layer, to form permanent spacers laterally to the LV gate regions; removing the protection silicide mask; and forming silicide regions on the LV source and drain regions and on the LV gate regions.

19 Claims, 11 Drawing Sheets

METHOD FOR MANUFACTURING ELECTRONIC DEVICES, COMPRISING NON-SALICIDED NON-VOLATILE MEMORY CELLS, NON-SALICIDED HV TRANSISTORS, AND LV TRANSISTORS WITH SALICIDED JUNCTIONS WITH FEW MASKS

TECHNICAL FIELD

The present invention relates to a method for manufacturing electronic devices, and in particular non-salicided non-volatile memory cells, non-salicided HV transistors, and LV transistors with salicided junctions.

BACKGROUND OF THE INVENTION

The need has recently arisen in advanced processes (gate lengths of 0.35 µm or less), to integrate non-volatile memories of EEPROM type in high-speed devices that use the technique of saliciding of the diffusions. As known, this technique is based on the use of a self-aligned silicide layer (salicide), which reduces the resistivity of the junctions. The salicide layer (typically made of titanium, but also of cobalt or another transition metal) is produced by depositing a titanium layer on the entire surface of the device, and carrying out a heat treatment which makes the titanium react with the silicon, left bare on the junctions and the gate regions, such as to form titanium silicide. Subsequently, the non-reacted titanium (for example deposited on oxide regions) is removed by etching using a suitable solution, which leaves the titanium silicide intact. Thereby, both the gate regions and the junctions have a parallel silicide layer with low resistivity (approximately 3–4 Ω/square), which reduces the resistance in series to the transistors. The salicide technique is described for example in the article "Application of the self-aligned titanium silicide process to very large-scale integrated n-metal-oxidesemi-conductor and complementary metal-oxide-semiconductor technologies", by R. A. Haken, in *J. Vac. Sci. Technol. B*, vol. 3, No. 6, November/December 1985.

The high voltages necessary for programming non-volatile memories (higher than 16 V) are however incompatible with saliciding the diffusions of memory cells, since the breakdown voltage of salicided junctions is lower than 13 V.

Process flows that allow integration of non-volatile memory cells and high-speed transistors with saliciding have been produced; however, this integration is made difficult by the fact that these components have different characteristics, and require different process steps. The large number of necessary masks is also disadvantageous in these flows.

SUMMARY OF THE INVENTION

The disclosed embodiments of the present invention provide a manufacturing method with fewer masks than known methods. The method is simple and has the lowest possible costs.

According to the present invention, a method is provided for manufacturing electronic devices, and in particular non-volatile memory cells, HV transistors and LV transistors. In particular, the method includes forming LV gate oxide regions above first areas of a silicon substrate where low-voltage transistors are to be formed, HV oxide regions above second areas of the substrate where high voltage transistors are to be formed, selection oxide regions, tunnel oxide regions, and matrix oxide regions above third areas of the substrate where selection transistors and memory transistors of EEPROM cells are to be formed. The method further includes forming floating gate regions above the tunnel oxide regions and the matrix oxide regions; forming insulating regions above the floating gate regions; forming LV gate regions above the LV gate oxide regions; forming first source and drain regions laterally to the LV gate regions, which includes forming sacrificial spacers laterally to the LV gate regions, forming LV source and drain regions in the first areas in a self-aligned manner with the sacrificial spacers, the LV source and drain regions having a first doping level, removing the sacrificial spacers, and forming LDD regions laterally to the LV gate regions inside the first areas in a self-aligned manner with the LV gate regions, and the LDD regions, having a second doping level lower than the first level. Subsequently, the method also includes forming silicide regions on the LV source and drain regions and on the LV gate regions; forming semiconductor material regions completely covering the second and third areas; and forming HV gate regions above the HV oxide regions, selection gate regions above the selection oxide regions, and control gate regions above the insulating regions.

BRIEF DESCRIPTION OF THE DRAWINGS

To facilitate understanding of the present invention, a preferred embodiment is now described, purely by way of non-limiting example, with reference to the attached drawings, in which.

DETAILED DESCRIPTION OF THE INVENTION

To help understanding of the present invention, a production method disclosed in European patent application 98830644.5, filed on Oct. 23, 1998 in the name of STMicroelectronics, Srl, is initially described with reference to FIGS. 1 to 25. In detail, this method makes it possible to produce a device comprising LV (low-voltage and high-speed) and HV (high-voltage) NMOS transistors, LV and HV PMOS transistors, and EEPROM memory cells formed by a selection transistor and a memory transistor.

In particular, owing to the duality in forming NMOS and PMOS transistors, the drawings show only the steps for NMOS transistors, and the steps for forming PMOS transistors are described in words alone. The EEPROM memory cells form a memory array, and are produced in a part of the wafer thereafter also designated matrix area 15.

Figure 1:
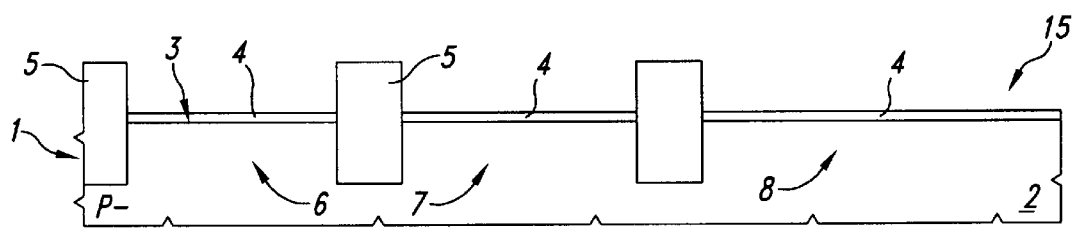
FIG. 1 shows a cross-section of a silicon wafer in a first step of a known production method.

In FIG. 1, a wafer 1 formed by a monocrystalline silicon substrate 2, here of P type, has been subjected to the active area definition steps. In detail, with the surface 3 of the substrate 2 covered by an active area mask 4 of non-oxidisable material (typically of a double layer of silicon oxide and silicon nitride, defined using resist), wafer I has been subjected to thermal oxidation; consequently, in the parts of the substrate 2 not covered by the active area mask 4, thick oxide layers (field oxide 5) have been grown, delimiting between each other active areas of the substrate, designed to accommodate various components of the device to be produced. In particular, FIG. 1 shows three active areas, i.e., a LV active area 6, designed to accommodate an LV NMOS transistor, an HV active area 7, designed to accommodate an HV NMOS transistor, and an active matrix area 8, designed to accommodate EEPROM memory cells.

Figure 2:
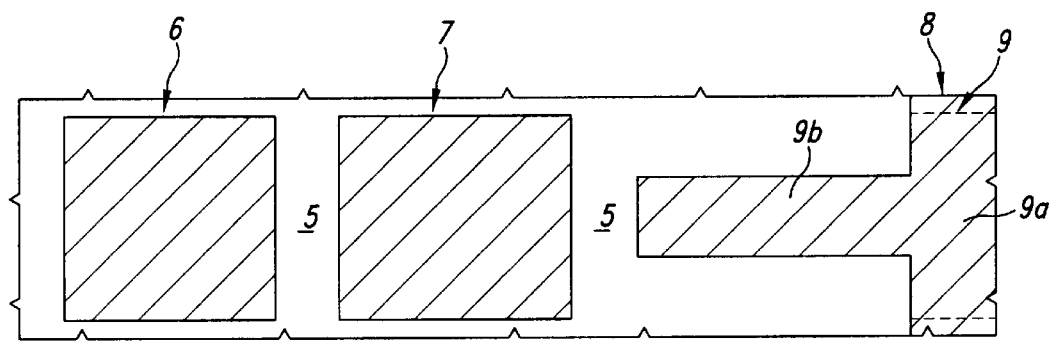
FIG. 2 is a plan view of the wafer of FIG. 1.

In detail, and in a known manner, the active matrix area 8 defines a grid, of which FIG. 2 shows in full only the part relative to one cell, indicated at 9, having substantially the shape of a "T" rotated by 90°, and comprises a leg 9a and a cross-piece 9b. The leg 9a is adjacent to, and electrically connected to, respective legs 9a of other cells arranged above and below the shown cell, of which only parts are visible; in addition, the leg 9a is connected to a leg of an adjacent cell to the right (not shown), which has a symmetrical structure with respect to that shown. The legs 9a are designed to accommodate source regions of the memory transistors; the end of the cross-pieces 9b not connected to the legs 9a is designed to accommodate drain regions of the selection transistors, and the gate regions of the cells must be provided on the crosspieces 9b. Further active areas are generally provided for forming LV or HV PMOS transistors, not shown in the drawings.

Figure 3:
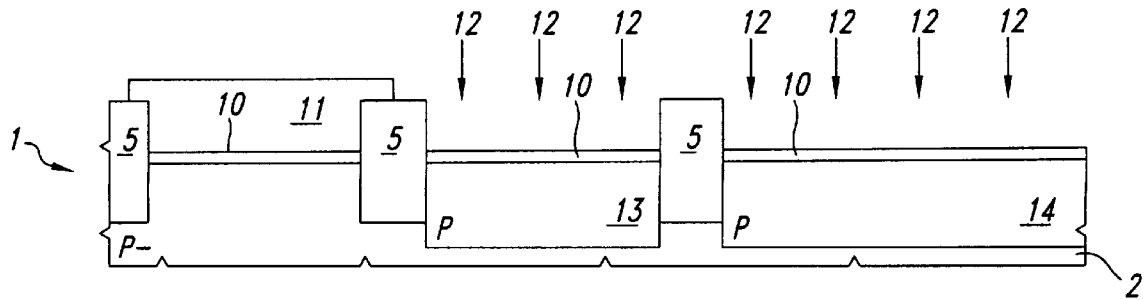
FIG. 3–7 show cross-sections similar to that of FIG. 1, in successive production steps.

Subsequently, the active area mask 4 is removed, the free surface 3 of the substrate is oxidated to form a sacrificial oxide layer 10, and doping ions of N type are implanted through a mask, for forming N-HV regions (not shown) for the HV PMOS transistors; using an HV P-well resist mask 11, covering the entire surface of wafer 1, except active HV area 7 and matrix area 8, doping ions of P type are implanted, as shown schematically in FIG. 3 by arrows 12. In the substrate 2, P-HV regions 13 of P type for high-voltage transistors, and a P-matrix region 14, also of P type, for the cells are then formed, as shown in FIG. 3. The P-HV regions 13 and P-matrix regions 14 reproduce exactly the shape of the active HV area 7 and matrix area 8, and thus, for each cell, legs 14a (corresponding to legs 9a of active cell areas 9, see FIG. 8), and cross-pieces 14b (FIG. 8, corresponding to cross-pieces 9b) are defined.

Figure 4:
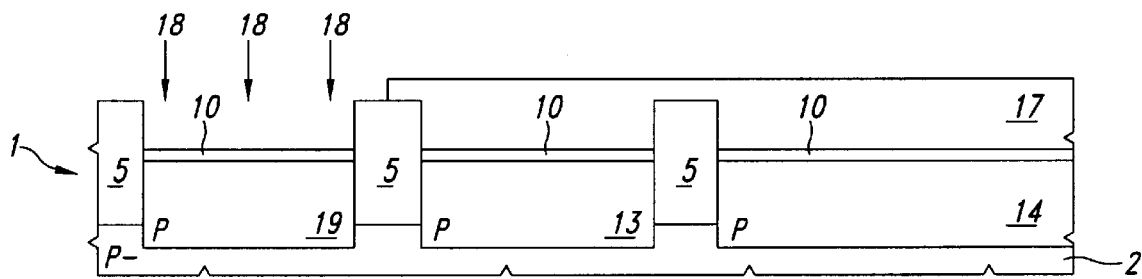

After removing the HV P-well mask 11, doping ions of N type are implanted through a mask for forming N-LV regions (not shown) for the LV PMOS transistors; then, using a LV P-well resist mask 17 covering the entire surface of the wafer 1, except active LV areas 6, doping ions of P type are implanted, as shown schematically in FIG. 4, by arrows 18. In the substrate 2, P-LV regions 19 of P type or the LV NMOS transistors are then formed, as shown in FIG. 4. Thereby, the PV region 13 and the P-LV regions 19 are separated from one another, and their electrical characteristics can be optimized with respect to the electrical characteristics required.

Figure 5:
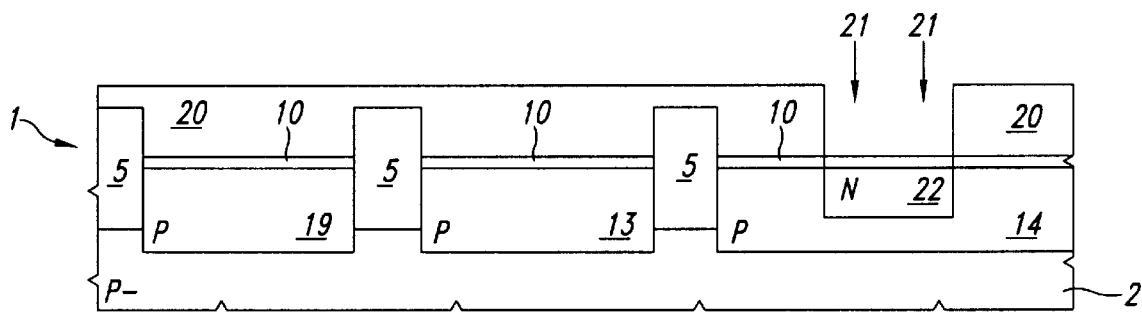
Figure 6:
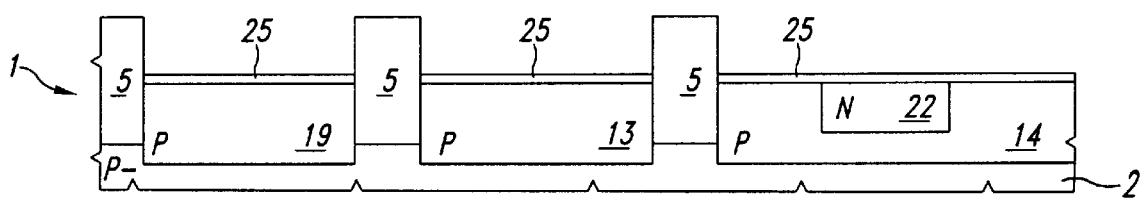

After removing the LV P-well mask 17, a capacitor mask 20 is produced, covering the entire surface of wafer 1, except strips perpendicular to cross-pieces 14b. Doping ions of N type (for example phosphorous) are then implanted, as shown schematically in FIG. 5 by arrows 21. In the cross-pieces 14b, continuity regions 22, of N type, are then formed, as necessary for electrical continuity between each selection transistor and the respective memory transistor of each cell. The structure of FIG. 5 is then obtained.

Figure 7:
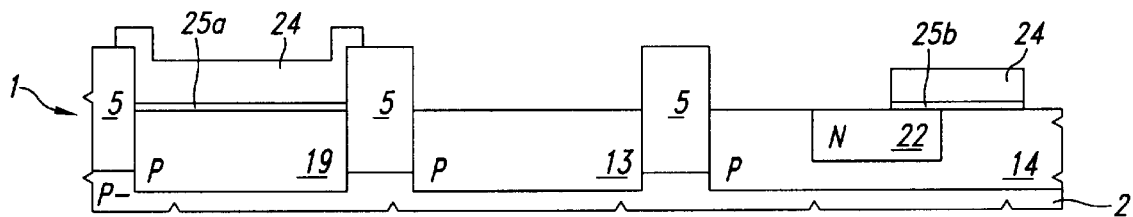
Figure 8:
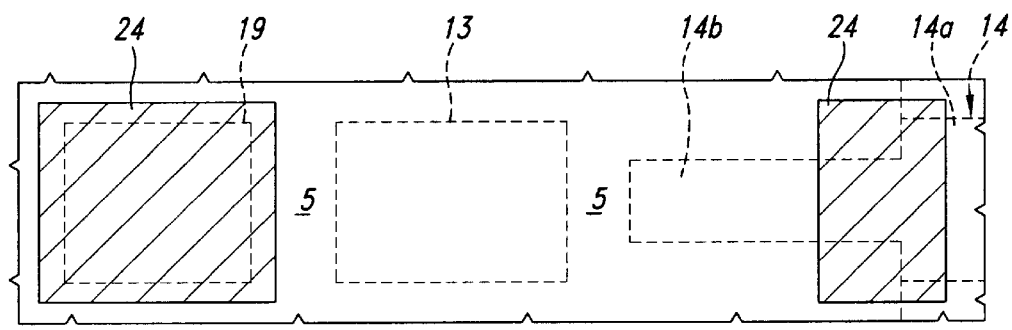
FIG. 8 is a plan view of the wafer of FIG. 7.

After removing the capacitor mask 20, the wafer 1 is subjected to annealing, the sacrificial layer 10 is removed, and matrix oxidation is carried out, forming a matrix oxide layer 25 on the surface of all regions 13, 14, and 19. Then, using a matrix oxide mask 24, shown in cross-section in FIG. 7 and in plan view in FIG. 8, the matrix oxide is removed from everywhere except from beneath the matrix oxide mask 24, forming a region 25b in the P-matrix region 14 that is partially arranged above the continuity region 22, and partially covers the leg 9a, and a masking region 25a on the P-LV region 19 (FIG. 7).

Figure 9:
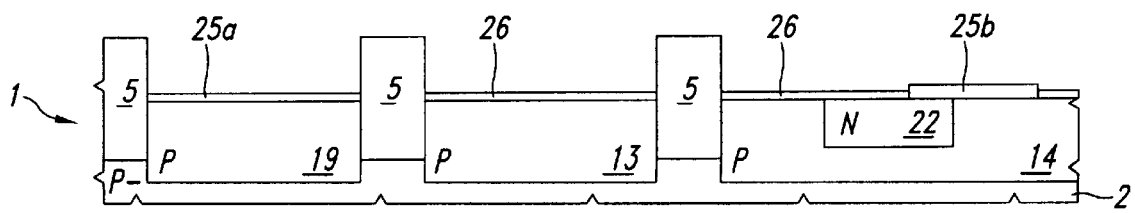
FIGS. 9–11 show cross-sections similar to that of FIG. 7, in successive production steps.

After removing the matrix oxide mask 24, wafer 1 is oxidized again, forming a tunnel oxide layer 26 on the entire surface of the substrate, where the latter is exposed, and increasing the thickness of the oxide that is already present (regions 25a, 25b) in regions 14 and 19. The structure of FIG. 9 is thus obtained.

Figure 10:
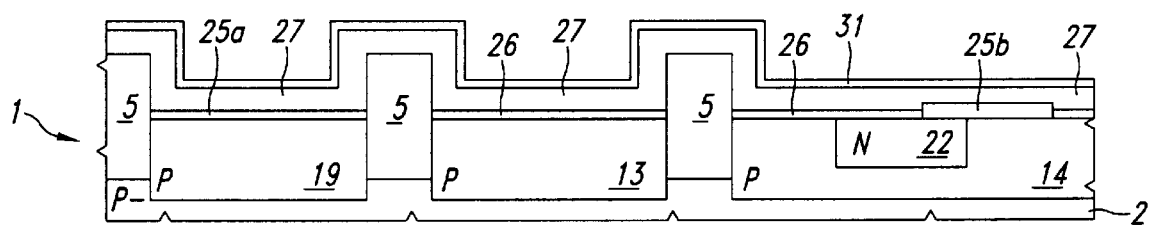

A first polycrystalline silicon layer is then deposited (poly1 layer 27), which is suitably doped; subsequently, an interpoly dielectric layer 31 is formed, for example of a triple layer of ONO (silicon oxide-silicon nitride-silicon oxide), as shown in FIG. 10.

Figure 11:
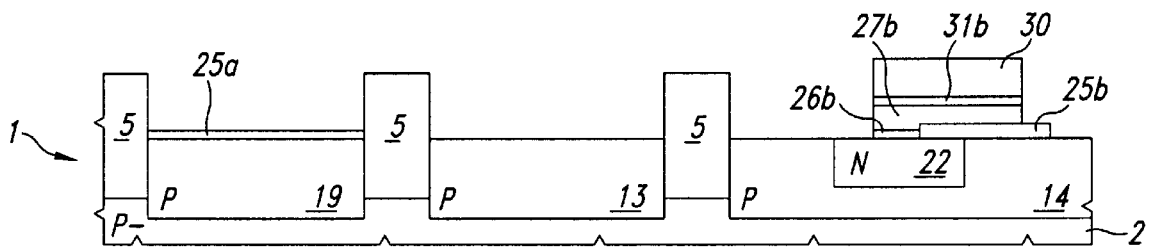
Figure 12:
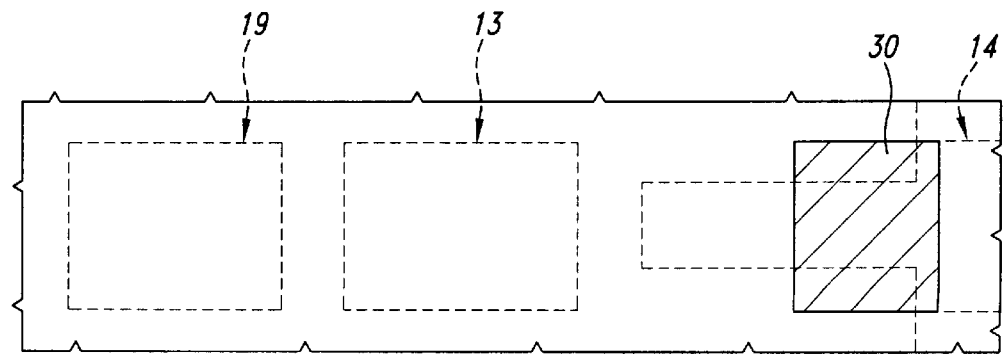
FIGS. 12 is a plan view of the wafer of FIG. 11.

A floating gate mask 30 shown in FIGS. 11 and 12 is then formed; dielectric layer 31, poly1 layer 27, and tunnel oxide layer 26 are then etched everywhere except where the floating gate regions of the memory transistors are to be formed, indicated at 27b in FIG. 11; consequently, of the tunnel oxide layer 26, only a tunnel region 26b is left, adjacent to an edge of the floating gate region 27b of the memory transistor. In this step, the thickness of the region 25a decreases again on the active area 19.

Figure 13:
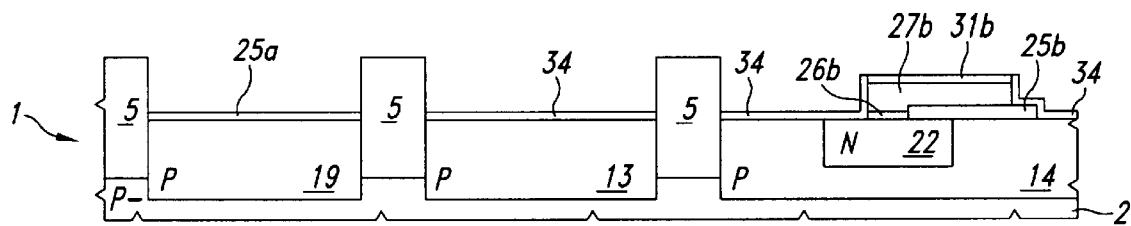
FIGS. 13–17 show cross-sections similar to that of FIG. 11, in successive production steps.

After removing the floating gate mask 30, an HV oxidation step is carried out, forming an HV gate oxide layer 34 on the entire free surface of substrate 2, in particular on P-HV regions 13 and P-matrix regions 14 (FIG. 13). Portions of oxide 34 are also formed laterally to the floating gate region 27b of the memory transistor, as shown in FIG. 13, and the thickness of the region 25a increases again.

Figure 14:
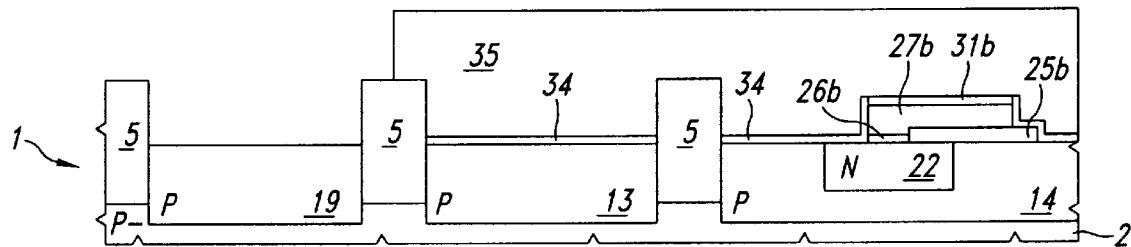

Subsequently, using an HV oxide resist mask 35, which covers the P-HV region 13 and the matrix area 15, the region 25a is removed from above the P-LV regions 19 (FIG. 14).

Figure 15:
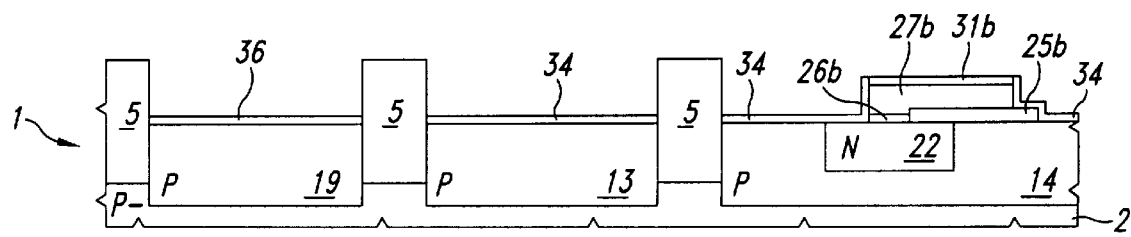

After removing the HV oxide mask 35, a LV oxidation step is carried out, forming a LV gate oxide layer 36 above the P-LV regions 19; in addition, the thickness of the HV gate oxide layer 34 increases above the P-HV region 13 and the P-matrix regions 14, thus providing the structure of FIG. 15.

Figure 16:
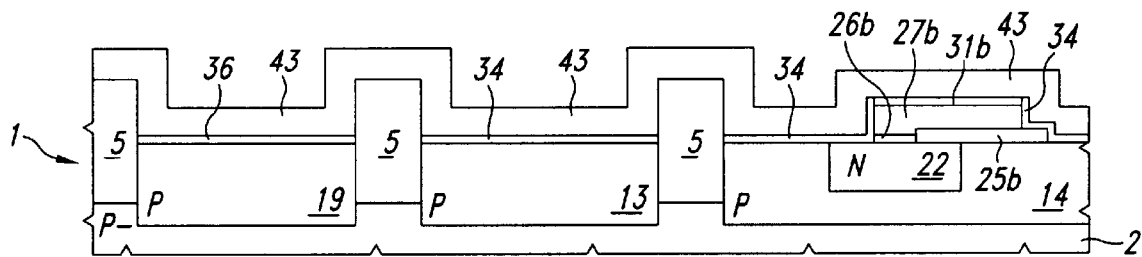
Figure 17:
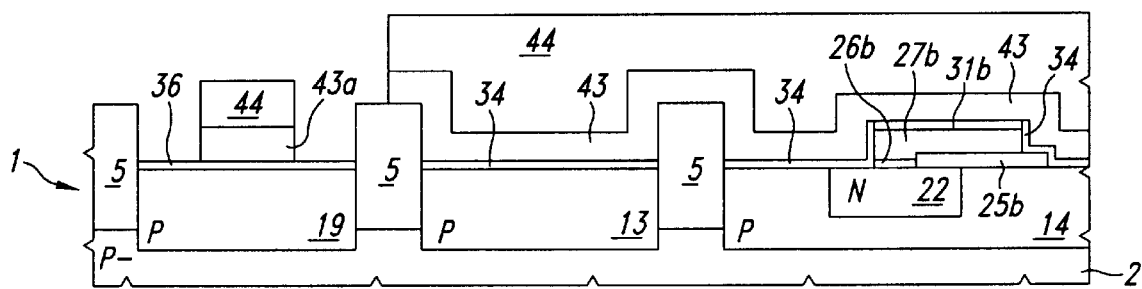
Figure 18:
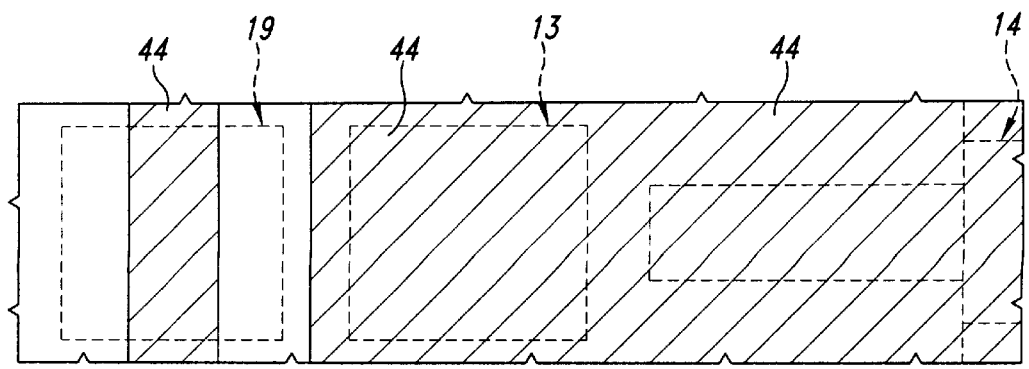
FIG. 18 is a plan view of the wafer of FIG. 17.

Then a second polycrystalline layer (non-doped poly2 layer 43) is deposited, as shown in FIG. 16. A LV gate mask 44 is formed, covering the N-HV regions (not shown), the P-HV regions 13, and the matrix area 15. In addition, the LV gate mask 44 covers the poly2 layer, above the P-LV regions 19, where both the NMOS and PMOS gate regions of the LV transistors must be defined, as shown in FIGS. 17 and 18, and above the N-LV regions (not shown) where the gate regions of the LV PMOS transistors must be defined. The exposed portions of the poly2 layer 43 are removed, thus providing the structure of FIG. 17, wherein the portions of poly2 remaining above P-LV regions 19 form gate regions 43 of the LV NMOS transistors. As can be seen, during the step of defining the gate regions of the LV transistors, the layers above the P-HV regions 13 and P-matrix regions 14 are protected, as are the layers above the N-HV regions (not shown); consequently, the method described provides separate definition of the gate regions of the LV transistors and HV transistors, as well as of the memory cells.

Figure 19:
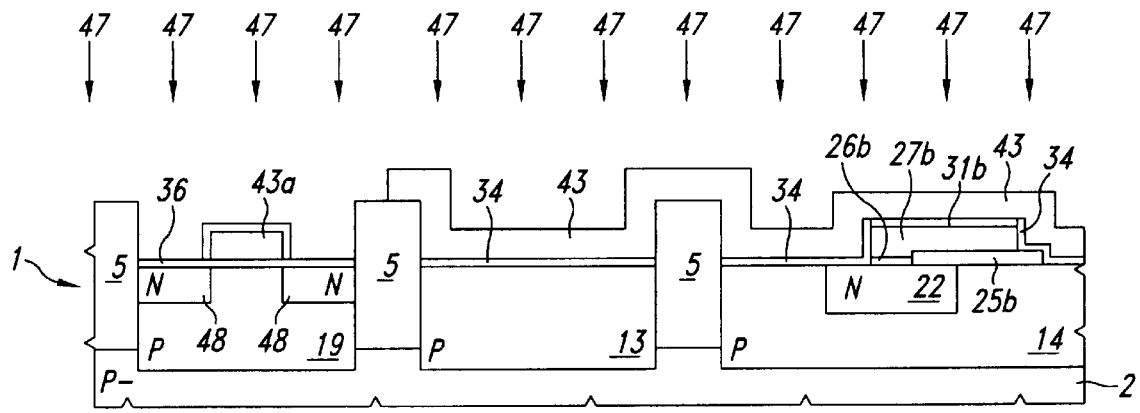
FIGS. 19–21 show cross-sections similar to that of FIG. 17, in successive production steps.

After removing the LV gate mask 44, and re-oxidation, to seal the gate regions 43a of the LV NMOS transistors, using a resist mask (not shown), which covers the N-LV and N-HV regions, doping ions of N type are implanted (LDDN implanting), as schematized in FIG. 19 by arrows 47. Laterally on the gate regions 43a (inside the P-LV regions 19), LDD regions 48 of N type are then formed; in addition, the poly2 layer 43 is suitably doped.

Figure 20:
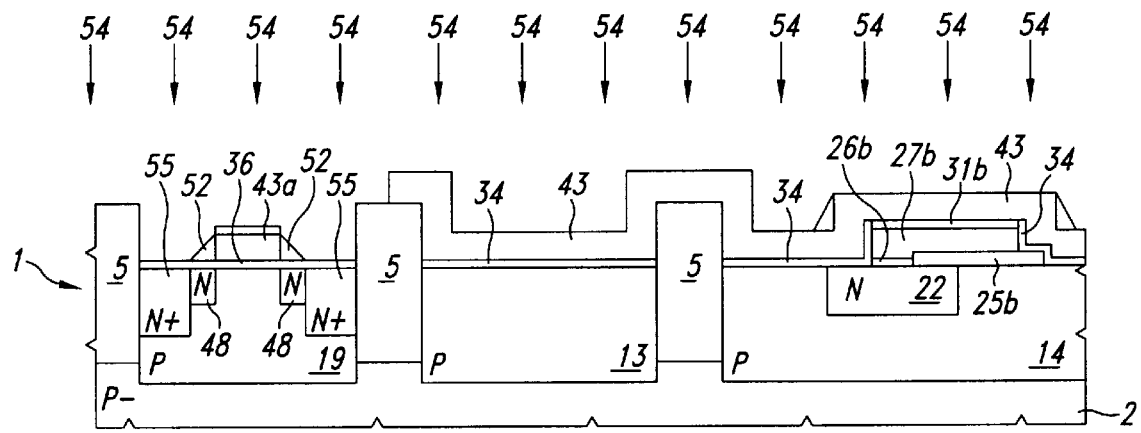

After removing the resist mask, masked implanting of doping ions of P type is carried out; in particular, during this step, the P-HV 13 regions and P-LV 19 regions, as well as the matrix region 15, are covered, whereas in the N-LV regions, LDD regions of type P (not shown) are formed. On the entire surface of the wafer 1, a dielectric layer (for example TEOS-TetraEthylOrthoSilicate) is then deposited; then, in a known manner, the TEOS layer is subjected to anisotropic etching. Therefore it is removed completely from the horizontal portions and remains laterally to the gate regions 43a, where it forms spacers 52, and partially on the floating gate regions 27b, on the matrix area 15 (FIG. 20). On the other hand, spacers are not formed above the field oxide regions 5, owing to the bird's beak shape of the latter (in a known manner, not shown for simplicity); furthermore, spacers are not formed above the P-HV regions 13 and the respective N-HV regions, since the gate regions of the HV transistors are not yet defined.

Subsequently, using a resist mask not shown, which covers the N-LV and N-HV regions, doping ions of N type are implanted, as schematized in FIG. 20 by arrows 54. LV-NMOS source and drain regions 55 of type N+ are then formed in the P-LV regions 19, in a self-aligned manner with the spacers 52. The LV-NMOS source and drain regions 55 are more highly doped than the LDD regions 48. In addition, the poly2 layer 43 and the gate regions 43a are doped N type, whereas the areas where HV and LV PMOS transistors are to be produced are covered. The structure of FIG. 20 is thus obtained.

After removing the resist mask (not shown), a similar step of masked implanting doping ions of P type is carried out, for forming respective source and drain regions in the N-LV regions (in a not shown manner), and for doping P type the poly2 layer 43, above the N-LV and N-HV regions. In this step, the P-LV regions 19, P-HV regions 13, and P-matrix region 14, are completely covered.

Figure 21:
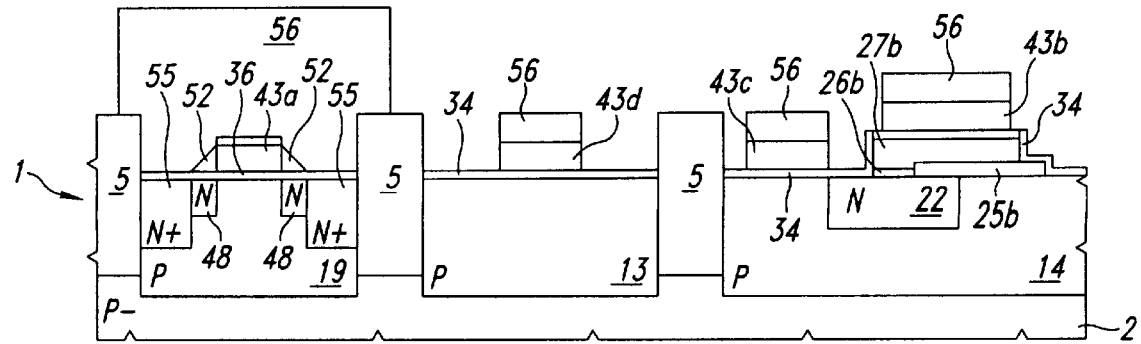
Figure 22:
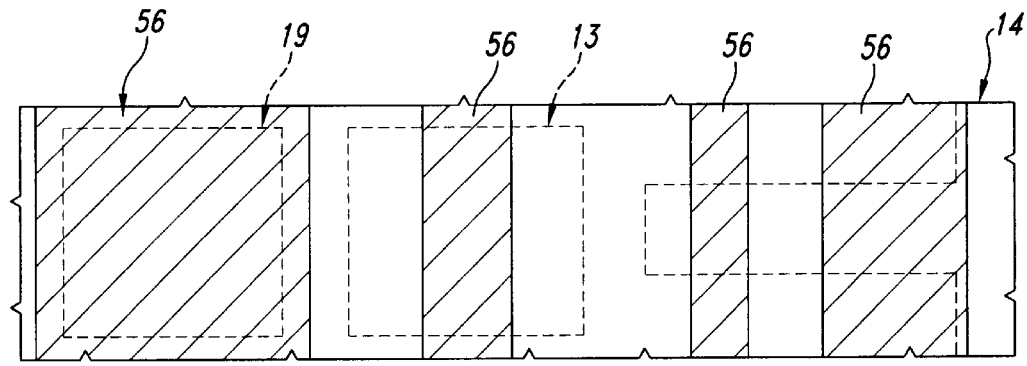
FIG. 22 is a plan view of the wafer of FIG. 21.

Subsequently, an HV gate mask 56 is formed, which covers the surface of the wafer 1, with the exception of the active areas where the gate regions of the high-voltage transistors are to be formed (P-HV regions 13, in the case of HV NMOS), and the portions of the P-matrix region 14 designed to form the gate regions of the selection transistor, and the control gate regions of the memory transistors (in this respect see FIGS. 21 and 22). Then, the portions of poly2 layer 43 not covered by the HV gate mask 56 are etched; the structure of FIG. 21 is thus obtained.

Figure 23:
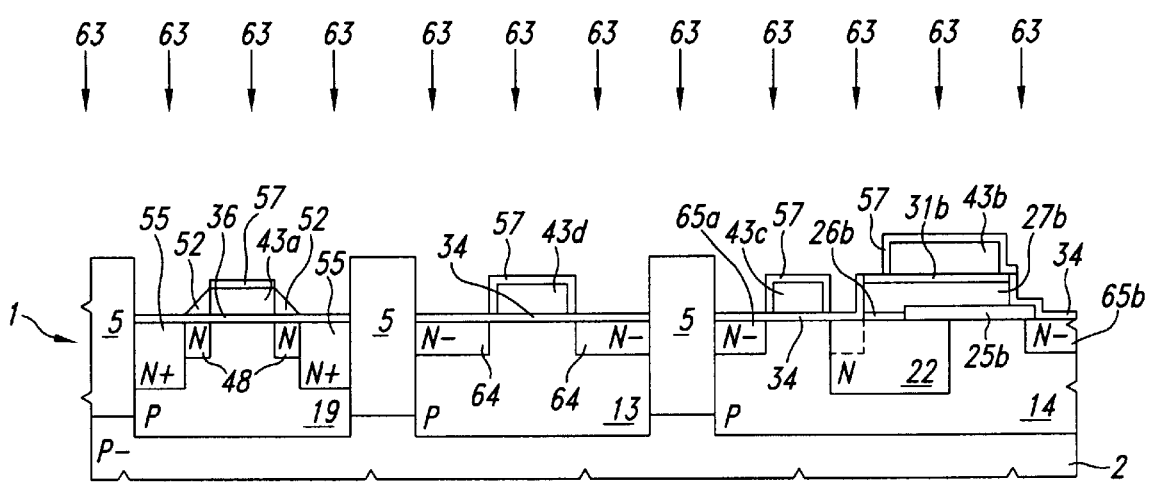
FIGS. 23–25 show cross-sections similar to that of FIG. 21, in successive production steps.

Subsequently, re-oxidation is carried out, forming an oxide layer 57 on the entire free surface of substrate 2, in particular laterally on the floating gate regions 27b and control regions 43b of the memory transistors, and laterally on the gate regions of the selection transistors, as shown in FIG. 23, wherein the gate region of the selection transistor is indicated at 43c, the gate region of the memory transistor is indicated at 43b, and the gate region of the HV NMOS transistor is indicated at 43d.

After removing the HV gate mask 56 and re-oxidation, an NHV mask, not shown, is formed, covering N-LV and N-HV regions (not shown). Using the NHV mask, doping ions of N type are implanted, as shown schematically in FIG. 23 by arrows 63. In P-HV regions 13, at both sides of HV gate regions 43d, HV-NMOS source and drain regions 64 of N type are then formed, less doped than LV-NMOS source and drain regions 55; simultaneously, in the P-matrix region 14, drain regions 65a of selection transistor are formed, on one side, in a self-aligned manner with the gate regions 43c of the selection transistors, and the source regions 65b of the memory transistor are formed on the side not facing the respective selection transistor, in a aligned manner with the gate region 43b of the memory transistors. In addition, the areas arranged between each selection transistor and the respective memory transistor are also implanted; however, this implanting generally takes place inside the continuity regions 22, more doped, and is therefore not shown (for this reason the respective area is represented with broken lines). However, in case of misalignments, this implanting guarantees electrical continuity. The HV-NMOS source and drain regions 64 of the HV selection transistor 65a, and the source regions 65b of the memory transistor (as well as the drain regions) have a lower doping level than the LV-NMOS source and drain regions 55, and thus have a higher breakdown voltage and higher resistivity.

After removing the NHV mask, the source and drain regions of the HV PMOS transistors (not shown) are similarly implanted using a mask.

Figure 24:
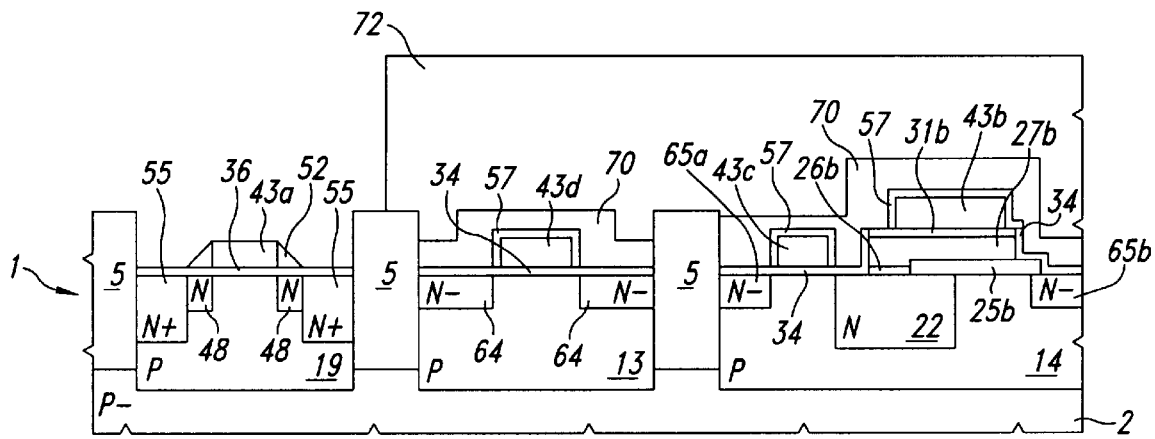

Subsequently a protection dielectric layer 70, for example of TEOS or nitride, is deposited on the entire surface of the wafer 1. A salicide protection mask 72, shown in FIG. 24, is then formed, covering the surface of wafer 1, except the active areas where the low-voltage transistors are formed (P-LV regions 19, for the NMOS). Using the salicide protection mask 72, dielectric layer 70 is removed from above the P10 LV regions 19 (FIG. 24). After removing the salicide protection mask 72, if zener diodes, low-doping precision resistors, and/or transistors of N and P type with non-salicided junctions are to be formed, a dielectric layer is deposited and defined using a suitable mask, in a not shown manner. Otherwise, the uncovered poly2 layer are immediately salicided. Saliciding, carried out in a known manner, as previously described, causes titanium silicide regions to form above the source and drain regions of the LV NMOS and PMOS transistors (silicide regions 75a1 above the LV-NMOS source and drain regions 55, and similar regions for the LV PMOS transistors), above the gate regions of the LV NMOS and PMOS transistors (silicide regions 75a2 above the gate regions 43a for the LV NMOS transistors, and similar regions for the LV PMOS transistors), as shown in FIG. 25.

Figure 25:
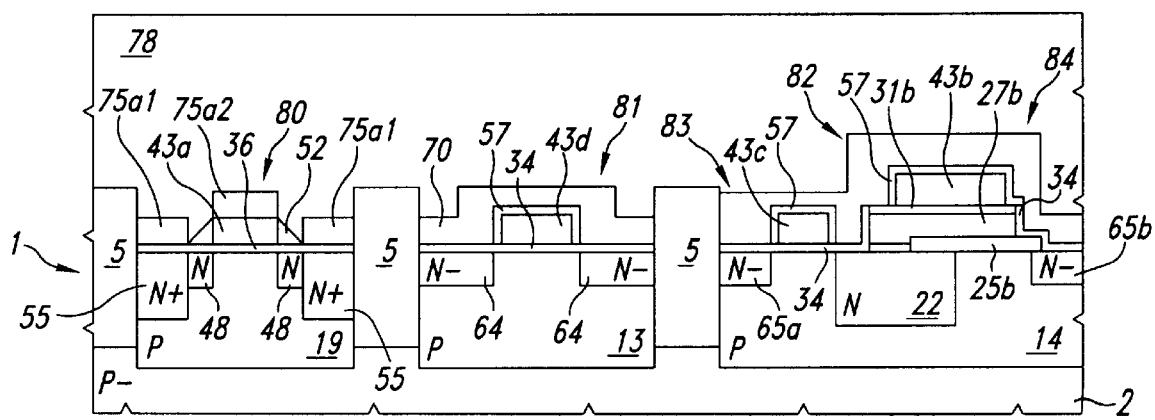

After forming a protection dielectric layer 78, the final structure of FIG. 25 is obtained, showing an LV NMOS transistor 80, an HV NMOS transistor 81, and an EEPROM cell 82, formed by a selection transistor 83 and a memory transistor 84. The final steps follow, including forming contacts and electrical interconnection lines, deposition of a passivation layer, etc.

As already stated, the method previously described requires many masks. To eliminate this problem, according to the invention a new manufacturing method is proposed, of which only the steps different from the preceding method are described.

In detail, the manufacturing method now described comprises initial steps that are the same as those described with reference to FIGS. 1–18, up to defining the gate regions of the LV transistors. Then, after re-oxidation for sealing the gate regions 43a of the LV NMOS transistors, sacrificial spacers 101 are formed; doping ions are heavy implanted, and subsequently, after removing the sacrificial spacers, light implanting is carried out (LDD implanting).

Figure 26:
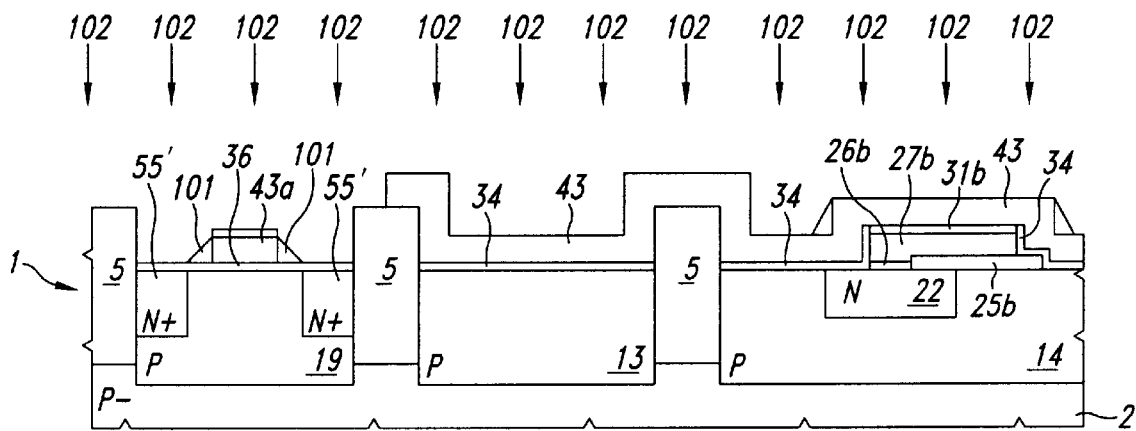
FIG. 26 shows a cross-section through a silicon wafer, in a step of the method according to the invention.

In particular, on the entire surface of wafer 1, a sacrificial layer is deposited (of polysilicon, but also of a dielectric material such as nitride or TEOS-TetraEthylOrthoSilicate); then, in a known manner, the sacrificial layer is subjected to anisotropic etching, to remove it completely from the horizontal portions, while remaining on the sides of the gate regions 43a, where it forms sacrificial spacers 101, and, partially, on the floating gate regions 27b, on the matrix area 15 (FIG. 26).

Subsequently, using a resist mask, not shown, covering the N-LV and NHV regions, N type doping ions are implanted, as schematized in FIG. 26 by arrows 102. LV-NMOS source and drain regions 55' of N+ type are then formed in the P-LV regions 19, in a self-aligned manner with the sacrificial spacers 101. In addition, in this step, poly2 layer 43 is suitably doped. Similarly to the previous method, after removing the resist mask, not shown, P type doping ions are implanted through a mask; in particular, during this step, P-HV regions 13, P-LV regions 19 and matrix area 15 are covered, whereas LDD regions of P type (not shown) are formed in the N-LV regions.

Figure 27:
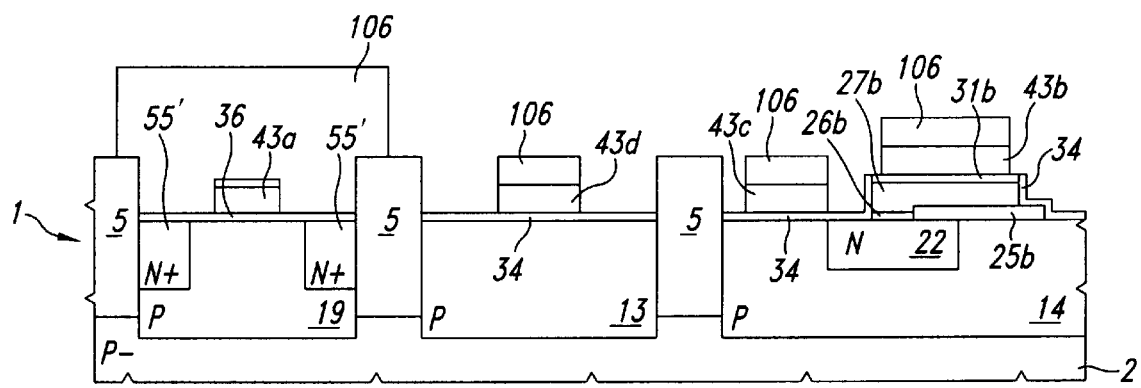
FIG. 27 shows a cross-section similar to that of FIG. 26, in a successive production step of the method according to the invention.
Figure 28:
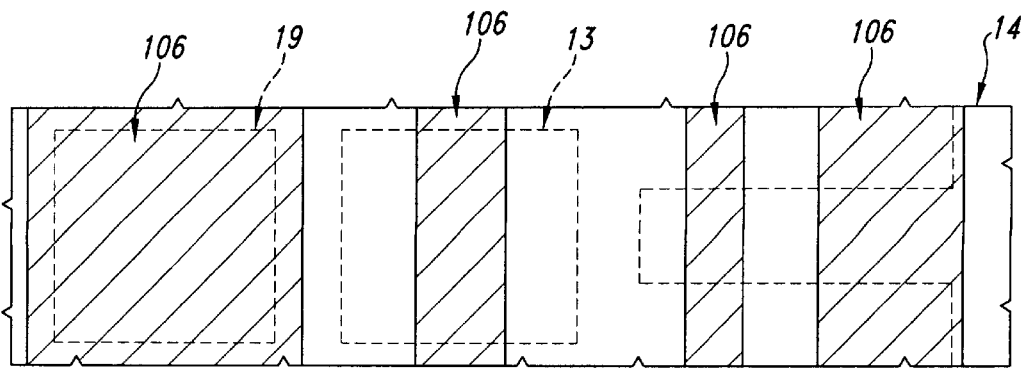
FIG. 28 is a plan view of the wafer of FIG. 27.

Then, the sacrificial spacers 101 are removed, and, as shown in FIG. 27, and in plan view in FIG. 28, an HV gate mask 106 is formed. The HV gate mask 106 covers the surface of the wafer 1, except the active areas where gate regions of the high-voltage transistors (P-HV regions 13, in the case of the HV NMOS), portions of the P-matrix region 14, designed to form the gate regions of the selection transistor, and control gate regions of the memory transistors are to be formed. Similarly to the previous method, in this step gate regions 43b, 43c and 43d are formed.

After removing the HV gate mask 106, re-oxidation is carried out, forming an oxide layer 57' on the entire free surface of the substrate 2, in particular laterally to gate regions 43a, 43b, 43c and 43d.

Figure 29:
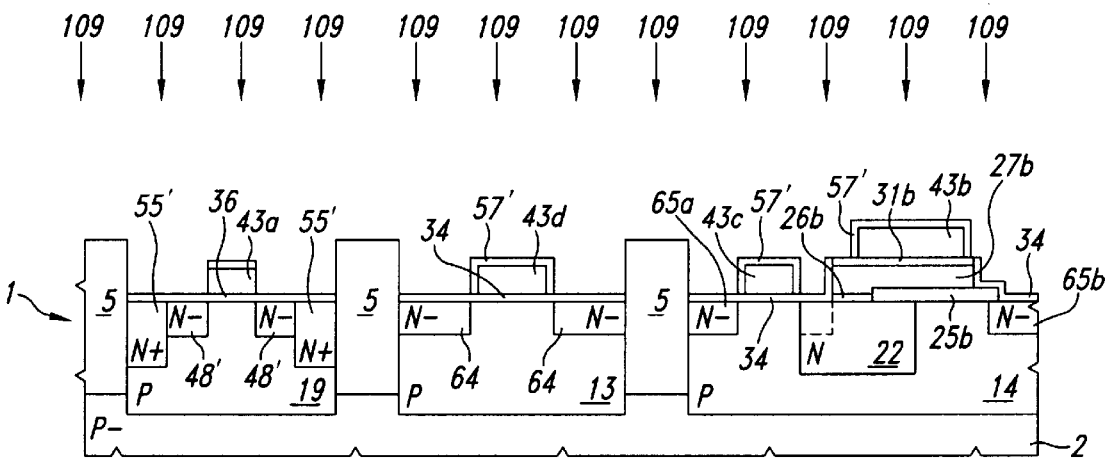
FIGS. 29–30 show cross-sections similar to that of FIG. 27, in successive production steps of the method according to the invention.

Then, using a resist mask, not shown, covering the N-LV and N-HV regions, light implanting of N type doping ions is carried out (LDDN implanting), as schematized by arrows 109 in FIG. 29. Laterally to the gate regions 43a (inside the PLV regions 19), LDD regions 48' of N type are then formed, less doped than LV-NMOS source and drain regions 55'.

Simultaneously, similarly to the previous method, in P-HV regions 13, HV-NMOS source and drain regions 64, and in the P-matrix region 14, drain regions 65a of the selection transistor and source regions 65b of the memory transistor are formed.

After removing the resist mask, not shown, similar masked implanting of doping ions of P type is carried out; in particular, during this step, P-HV regions 13, P-LV regions 19, and matrix zone 15 are covered, while P type LDD regions (not shown) are formed in the N-LV regions. On the entire surface of the wafer 1, a thick dielectric layer (for example TEOS-TetraEthylOrthoSilicate) is then deposited, as can be seen in FIG. 30 (dielectric layer 70).

Figure 30:
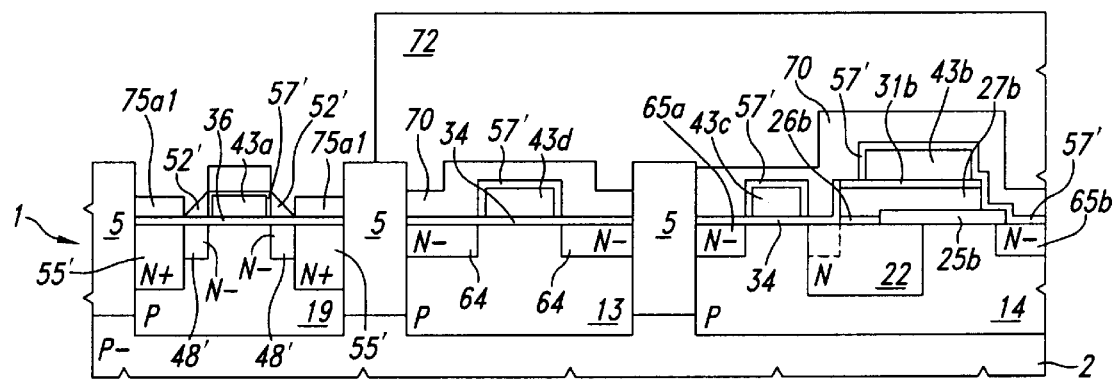

Subsequently, a salicide protection mask 72, shown in FIG. 30, is formed, covering the surface of the wafer 1, except the active areas, where the low-voltage transistors are present (P-LV regions 19, in the case of NMOS). Using the salicide protection mask 72, the uncovered portion of the TEOS layer 70 is anisotropically etched, forming spacers 52' laterally on the gate regions 43a (FIG. 30).

After removing the salicide protection mask 72, the uncovered poly2 layer is salicized. As previously described, saliciding forms titanium silicide regions 75a1, 75a2 above the source, drain and gate regions of the LV NMOS and PMOS transistors.

After forming a protection dielectric layer 78, the structure of the device obtained is the same as that according to the method previously described, and shown in FIG. 25. The final steps follow, including forming contacts and electrical interconnection lines, depositing a passivation layer etc. Thus, in the final device, as in the previous method, the EEPROM cells 72 are not salicided, and have a high breakdown voltage. Furthermore, memory transistor 84 is completely non-self-aligned. On the other hand, selection transistor 83 is self-aligned on both sides. This ensures a shorter structure, even in case of misalignments of individual shaping steps.

LV (NMOS and PMOS) transistors have a high-speed LDD structure with a dual gate (gate region 43a doped with ions of the same type as source and drain regions 48, 55); with salicided source and drain regions 55 and gate regions 43a.

The HV (NMOS and PMOS) transistors have a dual gate and drain extension, and are not salicided.

The described method thus forms simultaneously LV, HV and memory components with very different characteristics, thus optimizing the number of manufacturing steps. In particular, compared with the method described in the aforementioned patent application, it is possible to use fewer masks, since it is not necessary to carry out separate N- and P-implanting of HV and LV transistors, and thus the N-/P-regions can be subjected to a smaller number of thermal treatments.

In addition, since LDD implanting for forming LDD regions 48' is carried out defining the gate region 43d of the HV transistors, re-oxidation of the gate region 43d, comprising a heat treatment at 900° C., is carried out before light implanting of the LV transistors, and therefore ensures better control of the junction depth. Finally, it is apparent that many modifications and variants can be made to the method described and illustrated here, all within the scope of the invention, as defined in the attached claims.

We claim:

1. A method for manufacturing electronic devices having LV transistors, HV transistors and memory cells, the method comprising:

a) forming LV gate oxide regions above first areas of a silicon substrate where low-voltage transistors are to be formed, HV oxide regions above second areas of said substrate where high-voltage transistors are to be formed, selection oxide regions, tunnel oxide regions, and matrix oxide regions, above third areas of said substrate where selection transistors and memory transistors of EEPROM cells are to be formed;

b) forming floating gate regions above said tunnel oxide regions and said matrix oxide regions;

c) forming insulating regions above said floating gate regions;

d) forming LV gate regions above said LV gate oxide regions;

e) forming first source and drain regions laterally to said LV gate regions;

f) forming silicide regions on said LV source and drain regions and on said LV gate regions;

g) forming semiconductor material regions completely covering said second and third areas; and h) forming HV gate regions above said HV oxide regions, selection gate regions above said selection oxide regions, and control gate regions above said insulating regions, wherein said step e) of forming first source and drain regions laterally to said LV gate regions comprises:

i) forming sacrificial spacers laterally to said LV gate regions;

j) forming LV source and drain regions in said first areas, in a self-aligned manner with said sacrificial spacers, said LV source and drain regions having a first doping level;

k) removing said sacrificial spacers; and l) doping the LV gate oxide regions to form LDD regions laterally to said LV gate regions, inside said first areas, in a self-aligned manner with said LV gate regions, and said LDD regions having a second doping level lower than said first doping level.

2. The method of claim 1, wherein said step i) of forming sacrificial spacers comprises:

i1) depositing a sacrificial layer;

i2) subjecting said sacrificial layer to anisotropic etching.

3. The method of claim 1, wherein said steps i)–l) are carried out in sequence.

4. The method of claim 1, wherein in said step h), said HV gate regions, selection gate regions, and control gate regions, are formed simultaneously by shaping said semiconductor material regions.

5. The method of claim 4, wherein said step h) is carried out before said step l) of forming LDD regions.

6. The method of claim 4, wherein said step h) is carried out after said step j).

7. The method of claim 4, wherein said step h) is carried out after said step k).

8. The method according to of claim 1, wherein said step h) is carried out before said step l), and that simultaneously with said step l), the step is carried out of:

m) forming source and drain regions in said second and third areas, in an aligned manner with said HV gate regions, said selection gate regions and said floating gate regions.

9. The method of claim 8, comprising in sequence, after said step m), and before said step f), the steps of:

n) depositing a dielectric material layer on said first, second and third areas;

o) forming a protection salicide mask on said second and third areas; and p) anisotropically etching said dielectric material layer on said first areas, forming spacers laterally to said LV gate regions.

10. The method of claim 9, comprising the step of removing said salicide protection mask before said step f).

11. The method of claim 1 wherein after said step h) and before said step l), a re-oxidation step is carried out.

12. A method for manufacturing an integrated circuit having LV transistors, HV transistors, and memory cells, the method comprising:

forming LV gate regions above LV gate oxide regions on a silicon substrate;

forming first source and drain regions laterally to said LV gate regions, comprising:
   forming sacrificial spacers laterally to said LV gate regions;
   forming LV source and drain regions in a first area on the substrate in a self-aligned manner with the sacrificial spacers, the LV source and drain regions having a first doping level;
   removing the sacrificial spacers; and
   doping the LV gate oxide regions to form LDD regions laterally to the LV gate regions inside the first areas in a self-aligned manner with the LV gate regions, the LDD regions having a second doping level lower than the first doping level;

forming salicide regions on the LV source and drain regions and on the LV gate regions;

forming semiconductor material regions completely covering second and third areas on the silicon substrate; and forming HV gate regions above HV oxide regions, selection gate regions above selection oxide regions, and control gate regions above insulating regions on the substrate.

13. The method of claim 12, wherein forming sacrificial spacers comprises:

depositing a sacrificial layer; and subjecting the sacrificial layer to anisotropic etching.

14. The method of claim 12, wherein forming HV gate regions comprises forming HV gate regions, selection gate regions, and control gate regions simultaneously by shaping the semiconductor material regions.

15. The method of claim 12, wherein forming LDD regions further comprises simultaneously forming source and drain regions in the second and third areas in an aligned manner with the HV gate regions, the selection gate regions, and the floating gate regions.

16. The method of claim 15, comprising in sequence, after forming source and drain regions in the second and third areas, and before forming salicide regions on the LV source and drain regions:

depositing a dielectric material layer on the first, second, and third areas;

forming a protection salicide mask on the second and third areas; and anisotropically etching the dielectric material layer on the first areas to form spacers laterally to the LV gate regions.

17. The method of claim 16, wherein before forming salicide regions on the LV source and drain regions, the method further comprises removing a salicide protection mask.

18. The method of claim 17, wherein after forming the HV gate regions and before forming the LDD regions laterally to the LV gate regions, the method further comprises a reoxidation step.

19. The method of claim 12, comprising initially forming LV gate oxide regions above the first area of the silicon substrate where low-voltage transistors are to be formed, forming HV oxide regions above a second area on the substrate where high-voltage transistors are to be formed, forming selection oxide regions, tunnel oxide regions, and matrix oxide regions above a third area on the substrate where selection transistors and memory transistors of EEPROM cells are to be formed.

* * * * *

UNITED STATES PATENT AND TRADEMARK OFFICE
CERTIFICATE OF CORRECTION

PATENT NO. : 6,274,411 B1  Page 1 of 1
DATED : August 14, 2001
INVENTOR(S) : Matteo Patelmo et al.

It is certified that error appears in the above-identified patent and that said Letters Patent is hereby corrected as shown below:

<u>Title page,</u>
Item [30], the Foreign Priority Application number should read -- 98830771 --.

Signed and Sealed this

Fourteenth Day of May, 2002

*Attest:*

JAMES E. ROGAN
*Director of the United States Patent and Trademark Office*

*Attesting Officer*